(12) United States Patent
Leighton et al.

(10) Patent No.: US 6,806,106 B2
(45) Date of Patent: Oct. 19, 2004

(54) BOND WIRE TUNING OF RF POWER TRANSISTORS AND AMPLIFIERS

(75) Inventors: Larry Leighton, Scottsdale, AZ (US); Prasanth Perugupalli, Tempe, AZ (US); Nagaraj Dixit, Gilbert, AZ (US); Tom Moller, Gilroy, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/813,604

(22) Filed: Mar. 20, 2001

(65) Prior Publication Data

US 2002/0134993 A1 Sep. 26, 2002

(51) Int. Cl.[7] .......................... H01L 21/66; H01L 21/00; G01R 31/26
(52) U.S. Cl. ................. 438/17; 438/5; 438/6; 438/14; 324/719
(58) Field of Search ............................. 438/5–6, 10–14, 438/17–18; 324/719; 257/664, 700, 728

(56) References Cited

U.S. PATENT DOCUMENTS

| | | | | |
|---|---|---|---|---|
| 5,023,189 A | * | 6/1991 | Bartlow | 438/5 |
| 5,371,405 A | * | 12/1994 | Kagawa | 257/664 |
| 5,539,254 A | * | 7/1996 | Eytcheson et al. | 257/691 |
| 6,281,756 B1 | * | 8/2001 | Goto et al. | 330/302 |
| 6,331,804 B1 | * | 12/2001 | Shimizu et al. | 330/285 |

FOREIGN PATENT DOCUMENTS

| | | | | |
|---|---|---|---|---|
| JP | 404048756 A | * | 6/1990 | H01L/23/12 |
| JP | 406006150 A | * | 1/1994 | H03F/3/60 |

OTHER PUBLICATIONS

Smythe, W.R., "Static and Dynamic Electricity", Chapter X ("Alernating Currents"), p. 360, McGraw–Hill Book Company, 1950 (Second Edition).*

* cited by examiner

Primary Examiner—Nathan J. Flynn
Assistant Examiner—Johannes Mondt
(74) Attorney, Agent, or Firm—Baker Botts L.L.P.

(57) ABSTRACT

A method for manufacturing a power transistor circuit includes securing a die to a substrate, the die comprising a transistor having an input terminal and an output terminal. One or more performance characteristics of the transistor are measured. Using one or more wire sets, the transistor input terminal is electrically connected to one or more input matching elements and an input signal lead. The impedance of the one or more wire sets, as determined by selecting a desired number and/or length of the wires in each set, is selected based at least in part on the measured transistor performance characteristic(s). Similarly, using one or more additional wire sets, the transistor output terminal is electrically connected to one or more output matching elements and an output signal lead, wherein the impedance of the additional wire sets is selected based at least in part on the measured transistor performance characteristic(s).

8 Claims, 3 Drawing Sheets

BOND WIRE TUNING OF RF POWER TRANSISTORS AND AMPLIFIERS

BACKGROUND OF THE INVENTION

1. Field of the Invention

The present invention pertains generally to the field of manufacturing and tuning radio frequency (RF) power transistors and amplifiers.

2. Background

The use of RF power transistor devices as signal amplifiers, e.g., in wireless communication applications, is well known. With the considerable recent growth in the demand for wireless services, such as personal communication services, the operating frequency of wireless networks has increased dramatically and is now well into the gigahertz frequencies. For such high frequency amplifier applications, laterally diffused metal oxide semiconductor (LDMOS) transistors are usually preferred, but Bi-Polar and other transistor types may also be used.

In a typical deployment, a RF power transistor comprises a plurality of electrodes formed on a semiconductor (silicon) die, with each electrode comprising a plurality of interdigitated transistors. With a LDMOS device, the individual transistors of each electrode are connected to respective input (gate) and output (drain) terminals located on the top surface of the die, with the underside of the die comprising a common element (source) terminal. The die is attached—e.g., by a known eutectic die attach process—to a substrate serving as both a heat sink and common element ground reference. Further input and output transmission elements, such as one or more matching capacitors and/or shunt inductors may also be attached to the substrate surface. To complete the amplification circuit, respective input and output RF signal leads are electrically coupled by a plurality of bond wires to the respective input and output transmission elements, which in turn are electrically coupled to the respective input and output electrode terminals on the transistor die.

Production of RF power transistor amplifiers on a large scale basis is traditionally a problem, because of natural variables that the individual elements possess. In particular, the transistor devices have natural variances in input capacitance, gain and signal phase shift. Thus, in commercial implementations, significant time and effort is needed to first characterize a particular transistor device over the range of expected operating voltages, and then attempt to build many devices just like it which deliver a desired output gain and phase. However, due to the transistors' and various other elements, gain and phase variations over identical operating voltages, the ability to successfully tune transistor devices is limited.

Consistent performance of high frequency RF power transistors is, thus, problematic due to their natural variations. These variances must be compensated for in the amplification circuits to achieve reliable and consistent performance. For example, DC biasing and temperature compensation circuits are traditionally employed at the input of the device to compensate for inherent differences between individual power transistor devices and for changes in temperature during operation.

In addition to external matching of the input and output circuits, internal matching of the input and output transistor electrode terminals on the die to the input and output leads is also highly desirable for proper operation of a power transistor and amplifier devices. Unlike external device matching, however, internal matching to the respective input and output electrode terminals on the die is done at relatively low impedance levels—e.g., one tenth of an ohm to three ohms at the input terminal and five to eight ohms at the output terminal. As will be appreciated by those skilled in the art, the actual impedance at the respective electrode input and output terminals is a function of operating power and frequency, as well as the number of electrode cells and dies of the particular device.

Also known in the art are various forms of non-recoverable tuning techniques, e.g., laser trimming of capacitors in a matching or blocking circuit. However, non-recoverable tuning can be undesirable because it is performed before it is known whether a particular die functions as designed and generally at a point in the process where the amplifier device or circuit is nearly complete. In addition, laser trimming is irreversible, which makes rework of the particular device or circuit difficult or impossible.

SUMMARY OF THE INVENTION

In accordance with a first aspect of the invention, preferred methods of manufacturing and tuning power transistor devices and circuits are provided.

In one embodiment, a method for manufacturing a power transistor circuit includes securing a die to a substrate, the die comprising a transistor having an input terminal and an output terminal. One or more performance characteristics of the transistor are measured. Using one or more wire sets, the transistor input terminal is electrically connected to one or more input matching elements and an input signal lead. The impedance of the one or more wire sets, (as determined by selecting a desired number and/or length of the wires in each set, is selected based at least in part on the measured transistor performance characteristic(s). Similarly, using one or more additional wire sets, the transistor output terminal is electrically connected to one or more output matching elements and an output signal lead, wherein the impedance of the additional wire sets is selected based at least in part on the measured transistor performance characteristic(s).

Measurement of the transistor performance characteristic(s) may be performed by electrically coupling the transistor(s) to a known test network prior to attachment of the input/output transmission path connection wires. The performance characteristic(s) may include, by way of non-limiting examples, inherent input or output capacitance, impedance, gain flatness and signal phase shift. Alternately, the performance characteristic(s) may be measured by assembling the power transistor circuit or amplifier device, excepting one or more wires in the input and/or output transmission paths, measuring performance of the nearly completed device or circuit at the input and output leads, and then tuning the performance by selecting the number and/or length of additional input and/or output transmission path wires used to complete the device or circuit.

It is further contemplated by the invention to provide power transistor devices and circuits manufactured by the methods taught herein.

In one embodiment, a power transistor circuit includes a die secured to the substrate, the die comprising a transistor having an input terminal and an output terminal. An input lead, one or more input matching elements, output lead, and one or more output matching elements are also secured o the substrate. A plurality of wire sets electrically couple the transistor input terminal to the one or more of the input matching elements and input signal lead. Similarly, one or more additional wire sets electrically couple the transistor output terminal to the one or more output matching elements and the output lead. The impedance of at least one of the respective wire sets, as determined by selecting a desired number and/or length of the wires in the set, is selected based at least in part on a performance characteristic of the transistor measured after the die was secured to the substrate.

Other aspects and features of the invention will become apparent from consideration of the following detailed description taken in conjunction with the accompanying drawings.

BRIEF DESCRIPTION OF THE DRAWINGS

Preferred embodiments are illustrated by way of example, and not by way of limitation, in the figures of the accompanying drawings, in which like reference numerals refer to like components, and in which.

DETAILED DESCRIPTION OF PREFERRED EMBODIMENTS

Figure 1:
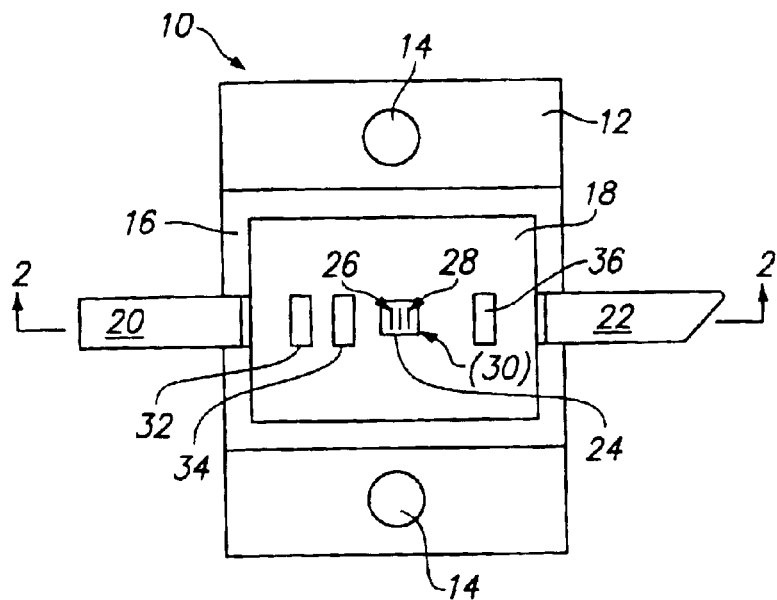
FIG. 1 is a top view of a partially assembled power transistor amplifier device.
Figure 2:
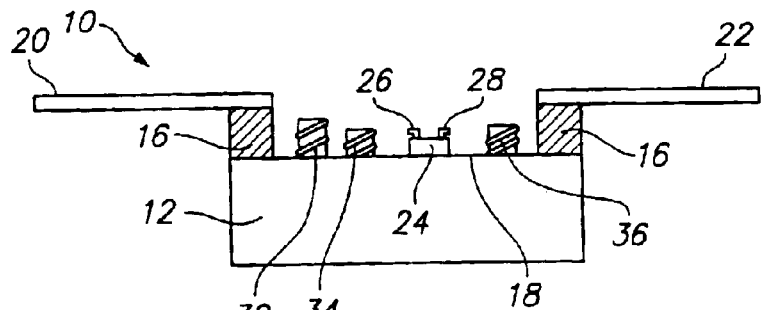
FIG. 2 is a cross sectional view of FIG. 1 taken along line 2—2.

FIGS. 1 and 2 show a partially assembled RF power transistor amplifier 10. The amplifier 10 comprises a substrate 12, which may include screw holes 14 for mounting the amplifier 10 to, e.g., a heat sink, although other means for attaching the substrate 12 are well known. A dielectric window 16 is disposed on a surface of the substrate 12. A conducting layer 18 is deposited on the exposed surface of the substrate 12 inside the dielectric window 16. Preferably, the conducting layer 18 is formed of a material having a high conductivity, such as gold, to facilitate good electrical and thermal conduction between components secured to the substrate surface and the substrate 12. An input lead 20 is attached to one side of the dielectric window 16, and an output lead 22 is attached to an opposing side. The dielectric window 16 electrically insulates the input and output leads 20 and 22 from the respective conducting layer 18 and substrate 12. The leads 20 and 22 are typically given different shapes in order to avoid confusion between them, once the amplifier 10 is assembled.

A semiconductor (silicon) die 24 is secured to the conducting layer 18, and thereby to the substrate 12, as well. In a preferred embodiment, the die 24 comprises a plurality of LDMOS power transistors arranged in a conventional fashion, including a plurality of input (gate) terminals 26 and output (drain) terminals 28 on a top side of the die 24. A common element (source) terminal 30 is formed on the underlying side of the die 24, directly coupled to the conductive layer 18.

The amplifier 10 includes first and second input matching capacitors 32 and 34, respectively, for matching the RF input signal impedance between the input lead 20 and the transistor input terminals 26. The amplifier 10 further includes an output matching (or "blocking") capacitor 36, respectively, for matching the RF output signal impedance between the transistor output terminals 28 and the output lead 22. Each of the input matching capacitors 32 and 34, and output blocking capacitor 36 has a metalized top-side terminal, a dielectric middle, and a metalized bottom-side terminal, wherein the respective bottom-side terminals are directly coupled to the conductive layer 18 in a known fashion. The values of the input and output matching/blocking capacitors 32, 34 and 36 is a function of their respective dimensions and the dielectric materials used. These parameters are preferably selected by the designer of the amplifier 10 in accordance with well-known techniques in order to specifically tune input and output impedance matching. It will be appreciated by those skilled in the art that differing power transistor amplifier embodiments may have more or less input and/or output matching elements, or may have differing elements in the respective input and/or output transmission paths. In some embodiments, there may be no matching or other elements in one or both of the input and output transmission paths. The inventive aspects taught herein are not to be limited to embodiments employing matching elements.

Figure 3:
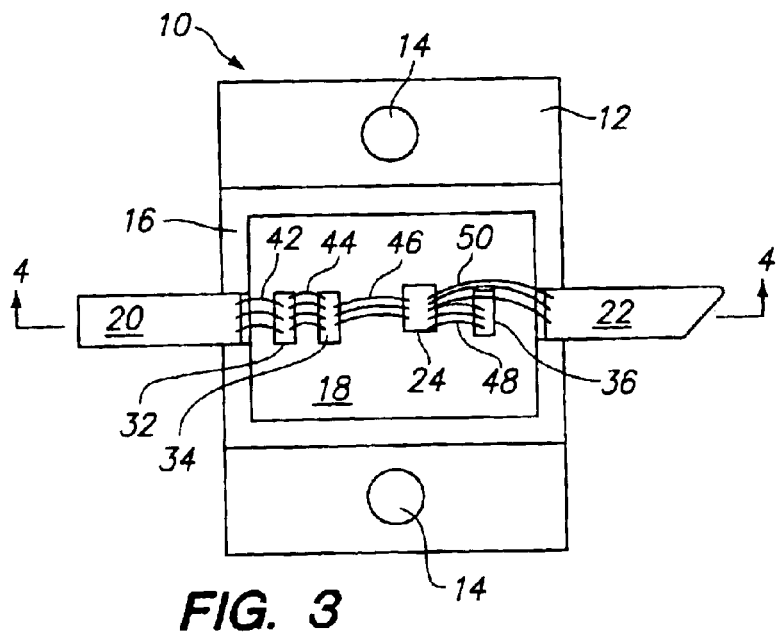
FIG. 3 is a top view of the amplifier device of FIG. 1 after further assembly in which various transmission bond wires are attached to electrically couple elements of the respective input and output transmission paths.
Figure 4:
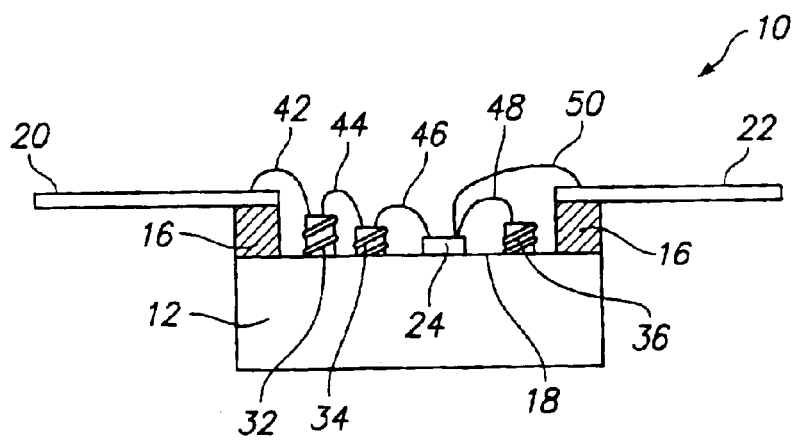
FIG. 4 is a cross sectional view of the FIG. 3, taken along line 4—4.

Referring to FIGS. 3 and 4, the next step in the assembly of the power transistor amplifier 10 is to electrically couple the various elements in the input transmission path using respective sets of one or more transmission ("bond") wires. The input lead 20 is electrically coupled to the top-side terminal of the first input matching capacitor 32 by a first set of bond wires 42; the top-side terminal of the first matching capacitor 32 is electrically coupled to the top-side terminal of the second input matching capacitor 34 by a second set of bond wires 44; the top-side terminal of the second matching capacitor 34 is electrically coupled to the transistor input terminals 26 by a third set of bond wires 46. The transistor output terminals 28 and the top-side terminal of the output blocking capacitor 36 are electrically coupled by a fourth set of bond wires 48. The transistor output terminals 28 are electrically coupled to the output lead 22 by a fifth set of bond wires 50.

Figure 5:
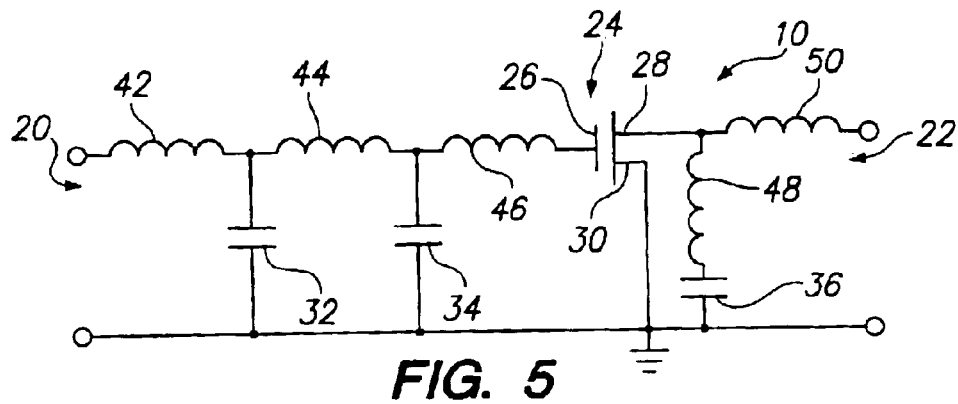
FIG. 5 is a simplified schematic of the amplifier device of FIG. 3.

FIG. 5 is a circuit schematic of the power transistor amplifier 10 after the bond wires are attached, in which the transmission inductance of the respective bond wire sets 42, 44, 46, 48 and 50 have the same reference number as in FIG. 4, for ease in illustration. It will be appreciated by those skilled in the art that the actual inductance value of any one of the bond wire sets 42, 44, 46, 48 or 50 is a function of the number and lengths, as well as the cross-sectional dimension and material properties, respectively, of the individual wires of the respective set. Notably, any one or more of the bond wire sets 42, 44, 46, 48 or 50 may have as few as one wire, with no per se limit on the maximum quantity, and the term "set" as used herein and in the claims shall have this meaning.

In accordance with a general aspect of the invention, prior to attachment of the respective bond wire sets 42, 44, 46, 48 or 50, one or more performance characteristics of the amplifier 10 are measured. In particular, by holding constant all other pertinent properties of the bond wires, it is possible to vary the length(s) of the respective bond wire sets between respective components of the transmission path in order to change their associated transmission inductance (as illustrated in FIG. 5). This, in turn, provides a mechanism for tuning the amplifier 10 to achieve optimum performance, without requiring subsequent non-recoverable tuning techniques.

Figure 6:
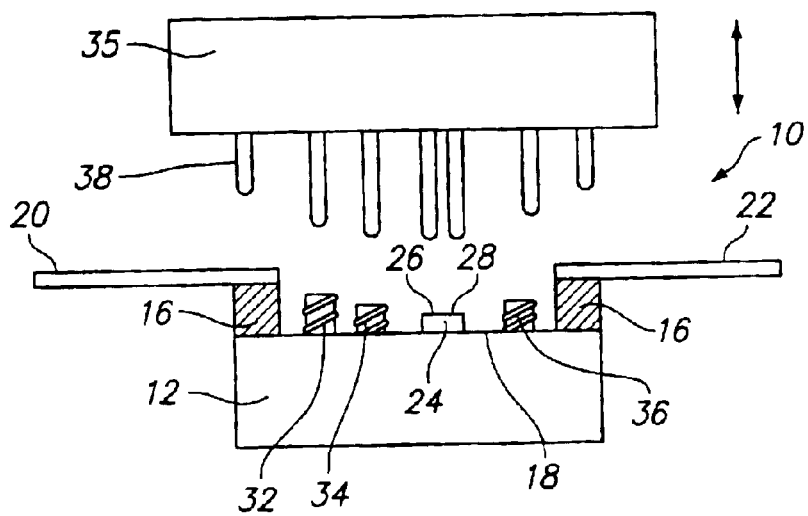
FIG. 6 is a cross sectional view of the amplifier device of FIG. 1, prior to attachment of the various transmission bond wires to electrically couple elements of the respective input and output transmission paths, illustrating a test procedure for measuring one or more performance characteristics of the device.

Referring to FIG. 6, the performance characteristics of the amplifier 10 may be measured by connecting the various components, e.g., the input lead 20, input matching capacitors 32 and 34, transistor input and output terminals 26 and 28, output matching capacitor 36 and output lead 22, respectively, to a test network 35. The test network 35 employs a plurality of coupling pins 38, which are adapted to form electrical connections with the respective amplifier elements (indicated by the double-headed arrow in FIG. 6). In particular, the test network 35 comprises circuitry (not shown) that models the connections to be made by the respective bond wire sets 42, 44, 46, 48 and 50.

By way of example, in one embodiment, the test network 35 comprises several inductors of known inductance connected across each adjacent set of connecting pins 38, thus forming a model of the circuit of FIG. 5. The circuit can be activated and one or more performance characteristics, such as input and output inherent capacitance, impedance, gain flatness, signal phase shift, and any other characteristics that can be affected by changing the inductance of the respective bond wire sets 42, 44, 46, 48 and 50 are then measured. As explained above, variations in transistors of each die 24 lead to slight variations in the electrical performance of each amplifier, even if all other component values are equal. For this reason, it is referred to herein as testing performance of the transistor(s), even though performance of the entire circuit may be measured.

The measured performance characteristics of a given power transistor amplifier 10 when coupled to the test network 35 will likely be different than a desired optimum performance. By using known relationships between measured electrical performance characteristics and the inductance values of the transmission path of FIG. 5, (e.g., of the respective bond wire sets 42, 44, 46, 48 and 50), an optimum performance of a given amplifier (or single transistor) can be achieved by setting the respective inductance values to achieve a desired output. In other words, based on the measured performance of a amplifier (or a single power transistor) in the test network 35, the lengths of one or more of the respective bond wire sets (42, 44, 46, 48 and 50) are selected to optimize performance of the completed amplifier. Once the performance of the amplifier 10 and test network is measured and the desired values (translated into lengths) for the individual bond wire sets 42, 44, 46, 48 and 50 have been determined, the test network 35 is de-coupled from the amplifier 10. The bond wire sets are sized and attached to the amplifier, as indicated in FIGS. 3–4, to complete the necessary electrical connections. In alternate embodiments, it may be desirable to attach at least some of the bond wires prior to testing the transistor performance characteristics.

Figure 7:
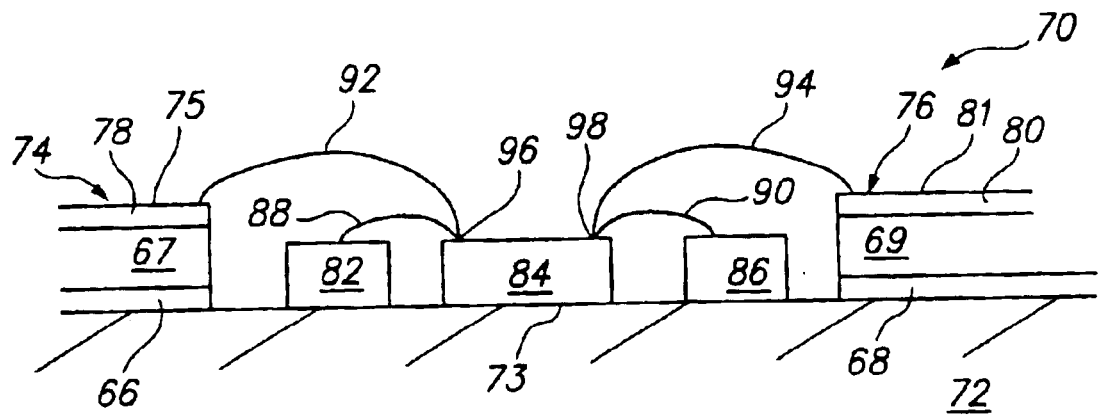
FIG. 7 is a cross sectional view of schematic illustration of a power transistor circuit.

For purposes of further illustration of the invention, FIG. 7 shows a power transistor circuit 70 including a transistor die 84 secured to a heat sink 72. The transistor die 84 comprises a plurality of LDMOS power transistors arranged in a conventional fashion, including a plurality of input (gate) terminals 96 and output (drain) terminals 98 on a top side of the die 84. A common element (source) terminal 73 is formed on the underlying side of the transistor die 84, directly coupled to the heat sink 72.

The power transistor circuit 70 includes an input blocking capacitor 82 attached to the heat sink 72 adjacent an input side of the transistor die 84, and an output blocking capacitor 86 attached to the heat sink 72 adjacent an output side of the transistor die 84. A first section of printed circuit board 75 is attached to the heat sink 72 adjacent the input blocking capacitor 82. A second section of printed circuit board 81 is attached to the heat sink 72 adjacent the output blocking capacitor 86. The first printed circuit board section 75 comprises a top conductive surface 78, dielectric layer 67, and bottom conductive surface 66, respectively, forming a capacitive RF signal input lead 74. Similarly, the second printed circuit board section 81 comprises a top conductive surface 80, dielectric layer 69, and bottom conductive surface 68, respectively, forming a capacitive RF signal output lead 76.

Each of the input and output blocking capacitors 82 and 86 has a metalized top-side terminal, a dielectric middle, and a metalized bottom-side terminal, wherein the respective bottom-side terminals are directly coupled to the heat sink 72 in a known fashion. Once coupled to the respective input and output transistor terminals 96 and 98, the blocking capacitors 82 and 86 form respective input and output inductive elements. The particular values of the capacitors 82 and 86 is a function of their respective dimensions and the dielectric materials used. These parameters are preferably selected by the designer of the power transistor circuit 70 in accordance with well-known techniques in order to specifically tune input and output impedance matching of the power transistor circuit 70, as further discussed below.

Figure 8:
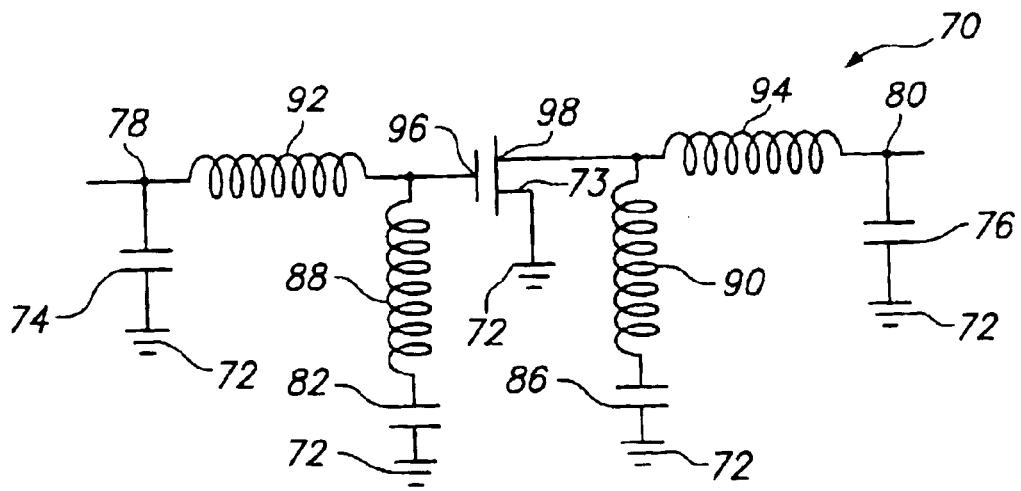
FIG. 8 is a simplified schematic of the power transistor circuit of FIG. 7.

To complete the transistor circuit 70, the input lead 74 is electrically connected to the transistor gate terminals 96 by a first set of bond wires 92, and the output lead 76 is electrically connected to the transistor output terminals 98 by a second set of bond wires 94. For tuning the circuit, e.g., to a desired resonant output frequency, the input shunt element is completed by electrically connecting the transistor input terminals 96 to the top side terminal of the input blocking capacitor 82 with a third set of bond wires 88, and the output shunt element is completed by electrically connecting the transistor output terminals 98 to the top side terminal of the output blocking capacitor 86 with a fourth set of bond wires 90. For purposes of further illustration, an equivalent electrical schematic of the completed power transistor circuit 70 is shown in FIG. 8.

In accordance with one aspect of the invention, a desired output resonant frequency of the power transistor circuit is obtained by tuning one or both of the input and output shunt inductance elements during the initial circuit assembly process. In one embodiment, the first and second sets of bond wires 92 and 94 are attached as shown in FIG. 7, and then the intrinsic input and out put capacitance of the circuit 70 is measured at the input and output terminals 78 and 80 before the input and output shunt elements are completed. From the measured inherent input and output capacitance, a desired value for each of the input and output shunt inductance elements for obtaining the desired resonant output frequency can be calculated, i.e., because the values of the input and output blocking capacitors 82 and 86 are known, and the only variable left in setting the respective shunt inductance values is the impedance of the bond wire sets 88 and 90, which is a measurable function of the number and/or lengths of the wires in each set.

In other words, based on known relationships in the values of the circuit elements, the respective number and lengths of the wires in each of the third and fourth bond wire sets 88 and 90 are calculated from the measured inherent input and output capacitance of the transistor circuit prior to their attachment. Because the number and lengths of the bond wires may be determined prior to their initial attachment, precise tuning of the power transistor circuit 70 may be accomplished as part of the initial assembly process. In some embodiments, it may be desirable to attach some of the bond wires of sets 88 and 90 prior to measuring the inherent capacitive characteristics of the transistor circuit, using that information to determine the length of the remaining wires in parallel to get the desired resonant output frequency.

While preferred embodiments and applications have been shown and described, as can be appreciated by those of ordinary skill in the art, the many features, aspects and advantages of invention may be embodied in numerous other embodiments and forms without departing from the inventive concepts contained herein. The presently disclosed embodiments, therefore, should be considered as illustrative, not restrictive. Accordingly, the invention should not be limited except by the scope of the appended claims and their equivalents.

What is claimed is:

1. A method of manufacturing a power transistor circuit, comprising carrying out the following steps in the enumerated order:
   (1) providing a substrate, said substrate comprising a pre-assembled power transistor circuit including a die secured to said substrate comprising a transistor having an input terminal, at least one input matching element and at least one input signal lead;
   (2) measuring a performance characteristic of the transistor before connecting the transistor with the input matching element and input signal lead by means of a test network comprising connections with known inductances;
   (3) using one or more wires to electrically couple the transistor input terminal to an input matching element, an input signal lead, or both; and
   (4) setting the impedance of the one or more wires based at least in part on the measured transistor performance characteristic from step (2).

2. The method of claim 1, wherein the performance characteristic is defined, at least in part, by one or more of input capacitance, impedance, gain flatness, and signal phase shift.

3. The method of claim 1, wherein the impedance of the one or more wires is set by selecting a number of wires used to make at least one electrical connection of the transistor circuit.

4. The method of claim 1, wherein the impedance of the one or more wires is set by selecting a length of at least one wire used to make at least one electrical connection of the transistor circuit.

5. A method of manufacturing a power transistor circuit, comprising carrying out the following steps in the enumerated order:
   (1) providing a substrate, said substrate comprising a pre-assembled power transistor circuit including a die secured to said substrate comprising a transistor having an output terminal, at least one input matching element and at least one input signal lead;
   (2) measuring a performance characteristic of the transistor before connecting the transistor with the input matching element and input signal lead by means of a test network comprising connections with known inductances;
   (3) using one or more wires to electrically couple the transistor output terminal to an output matching element, an output signal lead, or both; and
   (4) setting the impedance of the one or more wires based at least in part on the measured transistor performance characteristic from step (2).

6. The method of claim 5, wherein the performance characteristic is defined, at least in part, by one or more of output capacitance impedance, gain flatness, and signal phase shift.

7. The method of claim 5, wherein the impedance of the one or more wires is set by selecting a number of wires used to make at least one electrical connection of the transistor circuit.

8. The method of claim 5, wherein the impedance of the one or more wires is set by selecting a length of at least one wire used to make at least one electrical connection of the transistor circuit.

* * * * *